(12) United States Patent
Johal et al.

(10) Patent No.: US 10,448,515 B2
(45) Date of Patent: Oct. 15, 2019

(54) METHOD FOR REDUCING THE OPTICAL REFLECTIVITY OF A COPPER AND COPPER ALLOY CIRCUITRY AND TOUCH SCREEN DEVICE

(71) Applicant: Atotech Deutschland GmbH, Berlin (DE)

(72) Inventors: Kuldip Johal, Berlin (DE); Christian Lowinski, Berlin (DE); Michael Merschky, Berlin (DE); Kilian Klaeden, Berlin (DE); Jörg Schulze, Berlin (DE); Sebastian Reiber, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 15/329,582

(22) PCT Filed: Aug. 7, 2015

(86) PCT No.: PCT/EP2015/068267
§ 371 (c)(1),
(2) Date: Jan. 27, 2017

(87) PCT Pub. No.: WO2016/023828
PCT Pub. Date: Feb. 18, 2016

(65) Prior Publication Data
US 2017/0245372 A1   Aug. 24, 2017

(30) Foreign Application Priority Data

Aug. 15, 2014   (EP) .................................. 14181187

(51) Int. Cl.
*H05K 3/00* (2006.01)
*H05K 3/18* (2006.01)
(Continued)

(52) U.S. Cl.
CPC ......... *H05K 3/181* (2013.01); *C23C 18/1651* (2013.01); *C23C 18/31* (2013.01);
(Continued)

(58) Field of Classification Search
CPC ............ C23C 18/00; H05K 3/00; H05K 1/00; H05K 2203/00; C25D 3/00; C25D 5/00
See application file for complete search history.

(56) References Cited

U.S. PATENT DOCUMENTS 5,326,454 A   7/1994 Engelhaupt
6,120,639 A   9/2000 Redline et al.
(Continued)

FOREIGN PATENT DOCUMENTS

| CN | 103857826 | 6/1994 | |
|---|---|---|---|
| WO | WO-2013053518 A2 * | 4/2013 | ............ C23C 18/44 |
| WO | WO-2013165681 A1 * | 11/2013 | ............ C09D 11/10 |

OTHER PUBLICATIONS

"Surfactants based on fatty acids and other natural hydrophobes", Ingeg ard Johansson, Martin Svensson, Current Opinion in Colloid & Interface Science 6, 2001, pp. 178-188.*
(Continued)

*Primary Examiner* — Gordon Baldwin
*Assistant Examiner* — Mohammad Mayy
(74) *Attorney, Agent, or Firm* — Renner, Otto, Boisselle & Sklar, LLP

(57) ABSTRACT

The present invention relates to a method for reducing the optical reflectivity of a copper and copper alloy circuitry wherein a thin palladium or palladium alloy layer is deposited by immersion-type plating onto said copper or copper alloy. Thereby, a dull greyish or greyish black or black layer is obtained and the optical reflectivity of said copper or copper alloy circuitry is reduced. The method according to the present invention is particularly suitable in the manu-
(Continued)

facture of image display devices, touch screen devices and related electronic components.

16 Claims, 2 Drawing Sheets

(51) Int. Cl.
　　　C23C 18/16　　　(2006.01)
　　　C23C 18/54　　　(2006.01)
　　　H05K 1/02　　　(2006.01)
　　　C23C 18/31　　　(2006.01)
　　　C23C 18/48　　　(2006.01)
　　　C25D 3/38　　　(2006.01)
　　　C25D 3/58　　　(2006.01)
　　　C25D 5/02　　　(2006.01)
　　　C25D 5/56　　　(2006.01)

(52) U.S. Cl.
　　　CPC .............. *C23C 18/48* (2013.01); *C23C 18/54* (2013.01); *C25D 3/38* (2013.01); *C25D 3/58* (2013.01); *C25D 5/022* (2013.01); *C25D 5/56* (2013.01); *H05K 1/0274* (2013.01); *H05K 2201/2054* (2013.01); *H05K 2203/073* (2013.01); *H05K 2203/0709* (2013.01)

(56) References Cited

U.S. PATENT DOCUMENTS

| | | | |
|---|---|---|---|
| 8,216,645 B2* | 7/2012 | Abys | C23C 22/02 427/337 |
| 2001/0022989 A1* | 9/2001 | Soutar | C23C 18/42 427/97.1 |
| 2008/0224314 A1 | 9/2008 | Sparks | |
| 2012/0148733 A1* | 6/2012 | Arnd | C23C 18/54 427/123 |
| 2014/0057045 A1* | 2/2014 | Ramakrishnan | G06F 3/041 427/97.4 |
| 2014/0242265 A1 | 8/2014 | Hirsekorn et al. | |

OTHER PUBLICATIONS

PCT/EP2015/068267; PCT International Search Report and Written Opinion of the International Searching Authority dated Oct. 7, 2015.
Official Action for corresponding Chinese Application No. 201580043321.2 dated Sep. 4, 2018.

* cited by examiner

METHOD FOR REDUCING THE OPTICAL REFLECTIVITY OF A COPPER AND COPPER ALLOY CIRCUITRY AND TOUCH SCREEN DEVICE

The present application is a U.S. National Stage Application based on and claiming benefit and priority under 35 U.S.C. § 371 of International Application No. PCT/EP2015/068267, filed 7 Aug. 2015, which in turn claims benefit of and priority to European Application No. 14181187.7 filed 15 Aug. 2014, the entirety of both of which is hereby incorporated herein by reference.

FIELD OF THE INVENTION

The present invention relates to a method for reducing the optical reflectivity of a copper and copper alloy circuitry in the manufacture of electronic components such as image display devices and touch screen devices.

BACKGROUND OF THE INVENTION

The electrical circuitry of electronic components such as image display devices and touch screen devices can be manufactured by different methods. Said electrical circuitry most often comprises copper or a copper alloy due to the high electrical conductivity of said materials.

Such electrical circuitry can be for example manufactured by physical vapour deposition methods (PVD) such as sputtering or chemical vapour deposition methods (CVD) wherein copper or a copper alloy is deposited onto a dielectric substrate. Optionally, an adhesion layer, for example a layer of titanium, molybdenum or a multilayer stack comprising a titanium layer and a molybdenum layer is first deposited onto the substrate followed by depositing the copper or a copper alloy which is the main contributor of the electrical circuitry.

In another method for depositing an electrical circuitry onto a dielectric substrate in the manufacture of electronic components such as image display devices and touch screen devices, the electrical circuitry is deposited by electroless plating of copper or a copper alloy onto a substrate which is activated with a noble metal. Such an electroless (autocatalytic) plating method onto substrates activated with a noble metal is disclosed in EP 2 524 976 A1.

The electrical circuitry of electronic components such as image display devices and touch screen devices can also be manufactured by an additive method wherein a catalytic ink is deposited onto a dielectric substrate material such as polyethylene terephthalate (PET) foils and cured thereafter. The cured catalytic ink is then used as a plating base for electroless (autocatalytic) plating of copper and copper alloys thereon. Such additional copper or copper alloy layer(s) are necessary in order to obtain the required electrical conductivity for the circuitry pattern which is usually not obtained by the cured catalytic ink alone. A method for electroless plating of metals and metal alloys such as copper and copper alloys onto cured catalytic inks is for example disclosed in EP 13188464.5.

In still another manufacturing method, an electrical circuitry is deposited by electroplating copper or a copper alloy onto an electrically conductive pattern or layer attached to the dielectric substrate.

One disadvantage of such copper or copper circuitry independent of the method used to deposit copper or a copper alloy onto the substrate is the strong optical reflectivity of the shiny surface which leads to an optical visibility of said circuitry despite a very narrow circuitry line width of e.g. 50 µm, 20 µm, 10 µm and less, and proprietary circuitry pattern geometries such as rectangular or hexagonal grids used for image display devices and touch screen devices.

Different methods for reducing the optical reflectivity of copper and copper alloy surfaces in the manufacture of electronic components such as image display devices and touch screen devices are known in the art.

A blackening procedure for copper circuitry in the manufacture of electronic components such as touch screen devices is disclosed in US 2013/0162547 A1 wherein the copper surface is chemically oxidized to brown $Cu_2O$ and black CuO. Thereby, the optical reflection of the copper circuitry surface is reduced.

Another chemical oxidation procedure for copper circuitry in the manufacture of electronic components such as touch screen devices is disclosed in US 2014/0057045 A1. The copper surface is treated with chemical substances such as selenium compounds, sulfate compounds or triazole compounds in order to obtain a darkened copper surface and thereby reducing the optical reflectivity of the copper circuitry.

A method for reducing the optical reflectivity of a circuitry made of silver is disclosed in U.S. Pat. No. 7,985,527 B2. Silver is first blackened by a chemical oxidation treatment and then the black silver oxides formed are stabilized by contacting said silver oxides with a solution comprising either palladium ions or metallic palladium.

A disadvantage of such chemical oxidation treatments disclosed in the prior art is the weak mechanical stability of such surface oxide layers which are brittle and have a low adhesion to the underlying copper or silver surface. Accordingly, such blackened circuitry lacks reliability.

Another disadvantage of such chemical oxidation treatments is that copper of the circuitry lines is consumed during formation of copper oxides. Accordingly, portions of the initial copper circuitry are converted into electrically non-conductive copper oxides and the specific resistivity of said copper circuitry is increased after formation of copper oxides.

EP 0 926 263 A2 relates to a process for bonding resin-layers to a roughened copper foil in order to form a multilayer printed circuit board. The process involves microetching said copper foil and thereafter contacting the copper foil with an adhesion promoting composition comprising a reducing agent and a metal selected from the group consisting of gold, silver, palladium, ruthenium, rhodium, zinc, nickel, cobalt, iron and alloys of the foregoing metals. In one embodiment, an immersion-type palladium solution is used as the adhesion promoting layer in conjunction with the micro etching solution. The method does not relate to the formation of circuitry. The purpose of the treatment is provide a roughened copper foil which is thereafter laminated to a resinous layer. The method according to EP 0 926 263 A2 results in formation of a multilayer circuit board. It does not disclose manufacturing of copper circuitry suitable for image display devices and touch screens. US 2008/0224314 A1 discloses formation of a cap layer onto copper interconnect surfaces. The cap layer (see paragraph [0003]) can be Ni, Ni(P), Ni(Co) or Co(P). The cap layer serves to form a diffusion barrier and corrosion prevention layer on inlaid copper features, paragraph [0003]. It is suggested to deposit an "activation layer" such as palladium onto the surface of the copper interconnect which serves to promote subsequent deposition of another metal. US 2008/0224314

A1 does not disclose formation of a copper or copper alloy circuitry having deposited thereon a palladium or palladium alloy as the outermost layer.

OBJECTIVE OF THE PRESENT INVENTION

It is the objective of the present invention to provide a method for reducing the optical reflectivity of copper and copper alloy surfaces in the manufacture of electronic devices such as image display devices and touch screen devices with a sufficient mechanical stability and low-resistivity circuitry.

SUMMARY OF THE INVENTION

This objective is solved by a method for reducing the optical reflectivity of a copper and copper alloy circuitry comprising, in this order, the steps of
(i) providing a dielectric substrate,
(ii) depositing copper or a copper alloy onto said dielectric substrate with the proviso that said dielectric substrate comprises a plating base when copper or a copper alloy is deposited by electroless (autocatalytic) plating or electroplating, and
(iii) depositing a palladium or palladium alloy layer onto said copper or copper alloy by immersion-type plating and thereby reducing the optical reflectivity of said copper or copper alloy
and wherein the copper or copper alloy deposited in step (ii) is structured to form a circuitry either before step (iii) or after step (iii).

Deposition and depositing a copper or a copper alloy within the meaning of this invention includes physical vapour deposition methods (PVD) such as sputtering or chemical vapour deposition methods (CVD), electroless (autocatalytic) or electroplating, whereby copper or a copper alloy is deposited onto a dielectric substrate.

The resulting copper or copper alloy circuitry having a thin, immersion-type plated palladium or palladium alloy layer deposited on the surface has the desired reduced optical reflectivity compared to an untreated copper or copper alloy circuitry and an improved mechanical stability compared to blackened copper or copper alloy surfaces obtained by oxidative treatments known in prior art. Furthermore, the resistance to corrosion of said copper or copper alloy circuitry is increased.

In addition, the immersion-type plated palladium or palladium alloy layer is very thin which means that only a small portion of the copper or copper alloy circuitry is consumed during immersion-type plating. Hence, the electrical resistivity of such copper or copper alloy circuitry is also low as desired. The method for reducing the optical reflectivity of copper and copper alloy surfaces is particularly suitable in the manufacture of electronic components such as image display devices and touch screen devices.

The present invention further provides a touch screen device comprising a copper or copper alloy circuitry and a palladium or palladium alloy layer deposited by immersion-type plating onto said copper or copper alloy circuitry.

DETAILED DESCRIPTION OF THE INVENTION

Figure 1:
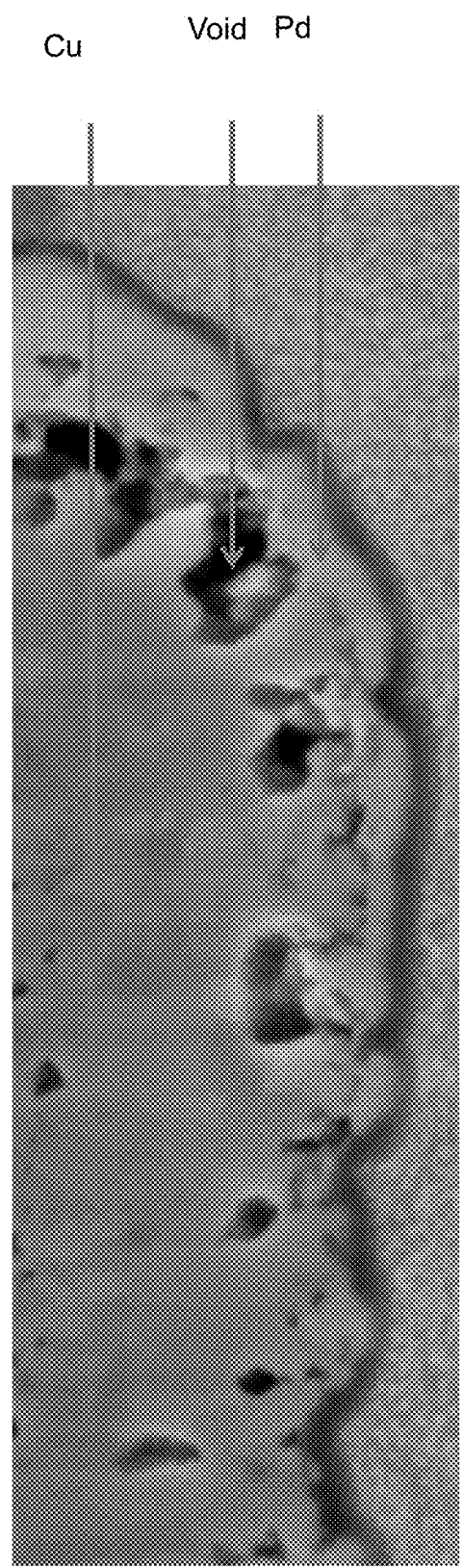
FIG. 1 shows an image of copper circuitry treated with the method according to the present invention (Example 4). FIB/SEM analysis was carried out on a FEI Nova NanoLab 600 Dual Beam FIB. The regions of interest for FIB cuts were sputter coated with carbon to achieve a good contrast to the underlying palladium. On top of the carbon layer a second layer of platinum was applied, which is required to carry out the FIB measurement).

Suitable dielectric substrate materials for electronic components such as image display devices and touch screen devices comprise plastic materials and glass materials.

Examples of suitable plastic materials comprise polyethylene terephthalate (PET), polyacrylates, polyurethane (PU), epoxy resins, polyimides, polyolefins, polycarbonate (PC), polymethyl methacrylate (PMMA), polyethylene naphthalate (PEN), polyethersulfone (PES), cyclic olefin polymers (COC), triacetylcellulose (TAC), polyvinylalcohol (PVA) and polystyrene (PS).

Examples of suitable glass materials comprise silica glass (amorphous silicon dioxide materials), soda-lime glass, float glass, fluoride glass, aluminosilicate glass, phosphate glass, borate glass, borosilicate glass, chalcogenide glass, sapphire glass and glass-ceramic materials.

The dielectric substrate materials can be provided in form of rigid sheets or bendable foils.

Preferably, the dielectric substrate material is selected from optically transparent materials among plastic materials and glass materials. The electrical circuitry made of copper or a copper alloy can be deposited by different methods onto the dielectric substrate. Said electrical circuitry can be deposited directly in the desired pattern or said pattern is formed after copper or copper alloy deposition by selectively removing portions of the copper or copper alloy layer.

The deposition of a palladium or palladium alloy layer onto said copper or copper alloy by immersion-type plating according to the method of the present invention can be after the desired pattern of the circuitry has been formed or before.

According to a first embodiment of the present invention, the step of
(iii) depositing a palladium or palladium alloy layer onto the copper or copper alloy by immersion-type plating is performed onto the a copper or copper alloy deposited in step (ii) which is structured to form a circuitry after step (iii) only.

According to a second and preferred embodiment of the present invention the step of
(iii) depositing a palladium or palladium alloy layer onto the copper or copper alloy by immersion-type plating is performed onto the a copper or copper alloy deposited in step (ii) which is structured to form a circuitry before step (iii).

The copper and copper alloy circuitry can be deposited onto the dielectric by a method selected from the group comprising physical vapour phase deposition (PVD), chemical vapour phase deposition (CVD), electroless (autocatalytic) plating and electroplating with the proviso that said dielectric substrate comprises a plating base when copper or a copper alloy is deposited by electroless (autocatalytic) plating or electroplating.

In a first embodiment of the present invention said electrical circuitry made of copper or a copper alloy is deposited directly onto the dielectric substrate by vapour deposition methods such as PVD, CVD and related methods such as plasma-enhanced CVD. Such methods for deposition of copper or copper alloys are known in the art.

In a second embodiment, the electrical circuitry made of copper or a copper alloy is deposited by vapour deposition methods such as PVD and CVD, and related techniques onto an adhesion layer attached to the dielectric substrate.

Suitable adhesion layer materials for this second embodiment are for example molybdenum, titanium, zirconium, aluminium, chromium, tungsten, niobium, tantalum, alloys and multilayer stacks of the aforementioned. Such adhesion layers may also be deposited by vapour deposition methods such as PVD and CVD, and related methods.

In a third embodiment of the present invention, the electrical circuitry made of copper or a copper alloy is deposited by electroless (autocatalytic) plating onto the dielectric substrate. A plating base on top of the dielectric substrate is required. Otherwise, autocatalytic plating of copper or a copper alloy onto a dielectric substrate is not possible.

Electroless (autocatalytic) plating electrolytes are to be understood as plating electrolytes which comprise a chemical reducing agent and are used for autocatalytic plating.

In a fourth embodiment of the present invention, the electrical circuitry made of copper or a copper alloy is deposited by electroplating onto electrically conductive portions of the dielectric substrate which are also referred herein to as "plating base". Such electrically conductive portions can be for example a metal or metal alloy layer deposited onto the dielectric substrate by vapour phase deposition methods such as PVD, CVD and related techniques.

Another type of suitable plating base for electroplating of copper and copper alloys thereon are electrically conductive polymers such as polythiophene, polypyrrol and polyaniline, and derivatives of the aforementioned which can be deposited onto the dielectric substrate e.g. by dip or spin coating, embossing and the like.

Conventional copper or copper alloy electroplating baths can be used to form the electrical circuitry on top of the dielectric substrate. Suitable copper or copper alloy electroplating bath compositions are known in the art and for example disclosed in "Modern Electroplating", 4$^{th}$ Edition, Eds. M. Schlesinger and M. Paunovic, John Wiley & Sons, Inc., 2000, pages 61 to 103. Particularly suitable electroplating bath compositions comprise a source for copper ions, an acid, organic additives and halogenide ions.

The term "plating base" is defined herein as a surface or portion of a surface, preferably on top of a dielectric substrate which either comprises a catalytically active metal and thereby initiates electroless (autocatalytic) plating of copper or a copper alloy thereon and/or provides an electrically conductive material for successive electroplating of copper and copper alloys thereon.

Suitable metals and metal alloys comprised in a plating base which initiates electroless (autocatalytic) plating of copper or copper alloys are further referred herein to as "catalytically active metals".

Suitable catalytically active metals and metal alloys for said plating base which initiates electroless (autocatalytic) plating of copper or a copper alloy thereon are for example copper, silver, gold, ruthenium, rhodium, palladium, osmium, iridium and platinum, mixtures and alloys thereof. The catalytically active metal or metal alloys can be for example provided in form of ions, as a colloid, as metallic particles embedded in a binder and as a layer comprising such metal which is for example deposited by PVD, CVD and related techniques.

Accordingly, the plating base comprises a catalytically active metal which initiates electroless (autocatalytic) plating of copper or a copper alloy thereon or an electrically conductive material which initiates electroplating of copper or a copper alloy thereon.

A plating base according to the present invention is also known as a "seed layer" in the art. A plating base or seed layer differentiates from the electrical circuitry deposited thereon by the thickness of said plating base which is much thinner than the copper or copper alloy layer used as the electrical circuitry. Accordingly, a plating base is not suitable to transport the required electrical current for a given electronic component. The thickness of a plating base is only some nanometer, e.g. 1 to 50 nm whereas the thickness of an electrical circuitry is preferably at least 500 nm or even 1 µm or more in order to carry the required amount of electrical current in a given electronic component such as a touch screen device.

Such a plating base can be directly deposited onto the dielectric substrate or for example after modification of the surface of said dielectric substrate with an adhesion layer. Suitable adhesion layers for such catalytically active metals in form of ions and colloids are for example nitrogen-containing substances and hydroxy carboxylic acids.

Metals such as molybdenum, titanium, zirconium, aluminium, chromium, tungsten, niobium, tantalum and alloys thereof provide a very good adhesion of the electrical circuitry on plastic materials and glass materials but do not initiate electroless (autocatalytic) plating of copper or a copper alloy. Accordingly, for such "non-catalytic" metals and metal alloys, an activation with a catalytically active metal is required prior to electroless (autocatalytic) plating of copper or a copper alloy thereon.

A method for electroless (autocatalytic) plating of copper or copper alloys onto adhesion layers selected from molybdenum, titanium, zirconium, aluminium, chromium, tungsten, niobium, tantalum, and alloys thereof is disclosed in EP 2 524 976 A1.

Suitable plating bases for electroless (autocatalytic) plating of copper and copper alloys comprising a catalytically active metal in ionic or colloidal form are for example disclosed in ASM Handbook, Vol. 5 Surface Engineering, 1194, p. 317-318.

Another type of a suitable plating base for electroless (autocatalytic) plating of copper or copper alloys and electroplating of copper and copper alloys are metals and metal alloys which are deposited by PVD or CVD methods in form of a thin layer or pattern onto a dielectric substrate. In case said metal or metal alloy layer deposited as a plating base is catalytically active for electroless (autocatalytic) plating of copper or a copper alloy, no further activation for electroless (autocatalytic) plating is required.

Still another type of suitable plating base for electroless (autocatalytic) plating of copper and copper alloys are catalytic inks which comprise a binder material and fine particles of a catalytically active metal or mixtures thereof or precursors thereof which can be converted into fine metal or metal alloy particles after deposition of the catalytic ink onto the dielectric substrate.

The fine metal or metal alloy particles (or precursor thereof after activation) serve as a plating base for electroless (autocatalytic) plating of copper and copper alloys.

The "catalytically active metal" in catalytic inks consists of fine particles of metals and/or metal alloys which are catalytically active for the metal or metal alloy to be deposited by electroless (autocatalytic) plating. Such catalytically active metals or metal alloys are known in the art. Suitable catalytically active metals are for example copper, silver, gold, ruthenium, rhodium, palladium, osmium, iridium and platinum, mixtures and alloys thereof.

Suitable catalytic inks comprising particles of catalytically active metals are for example disclosed in U.S. Pat. No. 8,202,567 B2 and WO 2014/009927 A2.

The binder in a catalytic ink is preferably selected from inorganic binders, polymeric binders and mixed inorganic-polymeric binders.

The catalytic ink may be deposited onto the dielectric substrate by methods such as screen printing, embossing, ink jet printing, flexographic printing, gravure printing, offset printing, imprinting and the like.

Curing of the catalytic ink after deposition onto the dielectric substrate means a process of drying, solidifying, and fixing the catalytic ink to the dielectric substrate. Suitable curing methods are for example heating by infrared heater, curing with an ultraviolet heater, curing with a laser, curing with a convection heater and the like.

Next, a copper or copper alloy layer is deposited by electroless (autocatalytic) plating onto said cured catalytic ink. A suitable method for electroless (autocatalytic) plating of metals and metal alloys such as copper and copper alloys onto cured catalytic inks is disclosed in EP 13188464.5.

Suitable electroless (autocatalytic) plating electrolytes for deposition of copper and copper alloys for all embodiments of the present invention comprise a source of copper ions and optionally a source of second metal ions, at least one complexing agent, at least one stabilizer additive and a reducing agent.

The concentration of copper ions preferably ranges from 1 to 5 g/l.

The concentration of the at least one complexing agent preferably ranges from 5 to 50 g/l.

The concentration of the reducing agent preferably ranges from 2 to 20 g/l.

The source for copper ions is preferably selected from water-soluble copper salts and other water-soluble copper compounds.

The source for copper ions is more preferably selected from the group comprising copper sulfate, copper chloride, copper nitrate, copper acetate, copper methane sulfonate, copper hydroxide; hydrates and mixtures of the aforementioned.

The at least one complexing agent is preferably selected from the group consisting of carboxylic acids, polycarboxylic acids, hydroxycarboxylic acids, aminocarboxylic acids, alkanol amines and salts of the aforementioned acids.

The at least one complexing agent is more preferably selected from the group comprising polyamino monosuccinic acid, polyamino disuccinic acid, tartrate, N,N,N',N'-tetrakis-(2-hydroxypropyl)-ethylenediamene, N'-(2-hydroxyethyl)-ethylenediamine-N,N,N'-triacetic acid, ethylenediamine-tetra-acetic acid, salts and mixtures thereof.

Preferred polyamino monosuccinic acids include ethylenediamine monosuccinic acid, diethylenetriamine monosuccinic acid, triethylenetetraamine monosuccinic acid, 1,6-hexamethylenediamine monosuccinic acid, tetraethylenepentamine monosuccinic acid, 2-hydroxypropylene-1,3-diamine monosuccinic acid, 1,2-propylenediamine monosuccinic acid, 1,3-propylenediamine monosuccinic acid, cis-cyclohexanediamine monosuccinic acid, trans-cyclohexanediamine monosuccinic acid and ethylenebis(oxyethylenenitrilo) monosuccinic acid.

Preferred polyamino disuccinic acids include ethylenediamine-N,N'-disuccinic acid, diethylenetriamine-N,N'''-disuccinic acid, triethylenetetraamine-N,N''''-disuccinic acid, 1,6-hexamethylenediamine N,N'-disuccinic acid, tetraethylenepentamine-N,N''-disuccinic acid, 2-hydroxypropylene-1,3-diamine-N,N'-disuccinic acid, 1,2 propylenediamine-N,N'-disuccinic acid, 1,3-propylenediamene-N,N''-disuccinic acid, cis-cyclohexanediamine-N,N'-disuccinic acid, transcyclohexanediamine-N,N'-disuccinic acid, and ethylenebis-(oxyethylenenitrilo)-N,N'-disuccinic acid.

Suitable stabilizer additives for electroless copper plating electrolytes are for example compounds such as mercaptobenzothiazole, thiourea and derivatives thereof, various other sulfur compounds, cyanide and/or ferrocyanide and/or cobaltocyanide salts, polyethyleneglycol derivatives, heterocyclic nitrogen compounds such as 2,2'-bipyridyl, methyl butynol, and propionitrile. In addition, molecular oxygen may also be used as a stabilizer additive by passing a steady stream of air through the copper electrolyte (ASM Handbook, Vol. 5: Surface Engineering, pp. 311-312).

Such plating bath compositions are preferably alkaline and optionally comprise an alkaline substance such as sodium hydroxide and/or potassium hydroxide in order to obtain the desired pH value. The pH value of the electroless (autocatalytic) plating bath used in step (ii) of the method according to the present invention more preferably ranges from 11 to 14, most preferably from 12.5 to 13.5.

The reducing agent is preferably selected from the group comprising formaldehyde, hypophosphite ions, glyoxylic acid, dimethylamine borane, borohydrides and mixtures thereof.

Optional sources for second metal ions (other than copper ions) are for example water-soluble salts and water-soluble compounds of metals such as nickel.

A preferred plating bath for electroless plating of copper and copper alloys comprises a source for copper ions and optionally a source for second metal ions, a source of formaldehyde or glyoxylic acid as reducing agent, and at least one polyamino disuccinic acid, or at least one polyamino monosuccinic acid, or a mixture of at least one polyamino disuccinic acid and at least one polyamino monosuccinic acid, or tartrate, a mixture of N,N,N',N'-tetrakis-(2-hydroxypropyl)-ethylenediamene and N'-(2-hydroxyethyl)-ethylenediamine-N,N,N'-triacetic acid, or a mixture of N,N,N',N'-tetrakis-(2-hydroxypropyl)-ethylenediamine and ethylenediamine-tetra-acetic acid and salts thereof as complexing agent. Said complexing agents are particularly preferred in combination with glyoxylic acid as the reducing agent.

The plating bath for electroless (autocatalytic) plating of copper and copper alloys is preferably held at a temperature in the range of 20 to 60° C., more preferably 25 to 55° C. and most preferably 25 to 45° C. during step (ii).

The dielectric substrate is preferably contacted with the electroless (autocatalytic) plating bath for 0.5 to 20 min, more preferably 1 to 15 min and most preferably 2 to 10 min during step (ii). The plating time may also be outside said ranges in case a particularly thin or thick copper or copper alloy layer is desired.

Thereby, a copper or copper alloy circuitry is obtained which has a shiny surface of copper colour and a high optical reflectivity The copper or copper alloy deposited in step (ii) is structured to form a circuitry either before step (iii) or after step (iii), i.e. before or after depositing a palladium or palladium alloy layer onto said copper or copper alloy by immersion-type plating and thereby reducing the optical reflectivity of said copper or copper alloy. Methods to form a circuitry from deposited copper or copper alloy are known in the art.

Electroless (autocatalytic) plating of copper or a copper alloy to form the electrical circuitry in step (ii) can be performed in horizontal, reel-to-reel, vertical and vertically conveyorized plating equipment. Such equipment is known in the art.

Electroplating of copper or a copper alloy to form the electrical circuitry in step (ii) can be performed in horizontal, reel-to-reel, vertical and vertically conveyorized plating equipment. Such equipment is known in the art.

Vapour phase deposition of copper or a copper alloy in step (ii) of the method according to the present invention can be performed in standard equipment for PVD and CVD methods. Such equipment and suitable PVD and CVD methods are known in the art.

In one embodiment of the present invention, the copper or copper alloy circuitry obtained in step (ii) is then contacted with a conditioner solution comprising at least one phosphonate compound between steps (ii) and (iii). The optional conditioner solution is preferably an aqueous solution. The term "phosphonate compound" is defined herein as organic compounds containing —C—PO(OH)$_2$ and/or —C—PO(OR$_2$) groups wherein R is selected from the group comprising substituted and unsubstituted alkyl, aryl and alkaryl.

This embodiment is particularly preferred when the immersion-type plating bath applied in step (iii) comprises a phosphonate compound.

More preferably, the at least one phosphonate compound is selected from compounds according to formula (1)

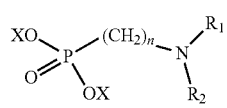

(1)

wherein
R1 is selected from the group consisting of

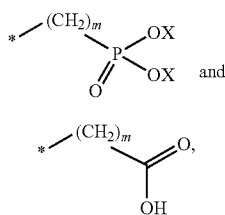

(2a)

(2b)

hydrogen, methyl, ethyl, propyl and butyl;
R2 is selected from the group consisting of

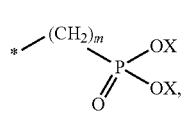

(2a)

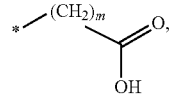

(2b)

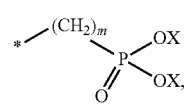

(2c)

hydrogen, methyl, ethyl, propyl and butyl;
R3 is selected from the group consisting of

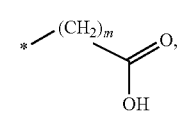

(2a)

(2b)

hydrogen, methyl, ethyl, propyl and butyl;
R4 is selected from the group consisting of

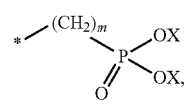

(2a)

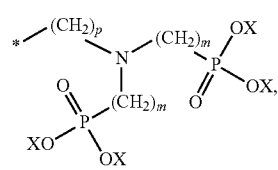

(2d)

hydrogen, methyl, ethyl, propyl and butyl;

n is an integer and ranges from 1 to 6; m is an integer and ranges from 1 to 6; o is an integer and ranges from 1 to 6; p is an integer and ranges from 1 to 6 and X is selected from the group consisting of hydrogen and a suitable counter ion. Suitable counter ions are for example lithium, sodium, potassium and ammonium.

More preferably, R1 and R3 are

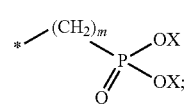

(2a)

R2 is

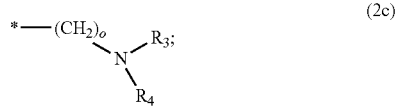
(2c)

and
R4 is

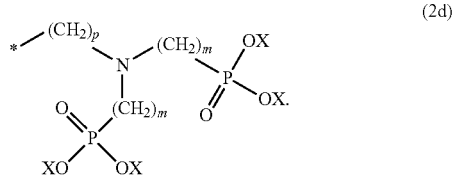
(2d)

Preferably, n, m, o and p independently are selected from 1 and 2. More preferably, n, m are 1; and o and p are 2.

The at least one phosphonate compound in the optional conditioner solution is most preferably selected from the group comprising 1-hydroxyethane-1,1,-diphosphonic acid, hydroxyethyl-amino-di-(methylene phosphonic acid), carboxymethyl-amino-di-(methylene phosphonic acid), amino-tris-(methylene phosphonic acid), nitrilo-tris-(methylene phosphonic acid), ethylendiamine-tetra-(methylene phosphonic acid), hexamethylendiamino-tetra-(methylene phosphonic acid), N-(phosphonomethyl) imidodiacetic acid, diethylenetriamine-N,N,N',N'',N''-penta-(methylphosphonic acid), 2-butane phosphonate 1,2,4-tricarboxylic acid, ethane-1,2-bis-(iminobis-(methylphosphonic acid)) and 2-phosphonobutane-1,2,4-tricarboxylic acid.

The concentration of the at least one phosphonate compound in the optional conditioner solution preferably ranges from 0.3 to 20 mmol/l, more preferably from 0.3 to 20 mmol/l and even more preferably from 0.3 to 8 mmol/l.

The dielectric substrate is optionally contacted with an aqueous acidic solution between steps (ii) and (iii). Said aqueous acidic solution preferably has a pH value in the range of 0.5 to 2 and comprises sulfuric acid. Such treatment of the copper surface is for cleaning and not for etching purposes. For this reason, generally no so-called micro etching solutions which contain an oxidising agent to etch away copper from the surface are employed in the cleaning step between steps (ii) and (iii) according to the present invention.

The surface of the copper or copper alloy deposited in step (ii) of the method according to the present invention is cleaned and better suited for the deposition of palladium or a palladium alloy thereon (step (iii)) when using said aqueous acidic solution between step (ii) and step (iii).

Next, a palladium or palladium alloy layer is deposited onto the surface of the copper or copper alloy obtained in step (ii) of the method according to the present invention by immersion-type plating.

The dielectric substrate comprising a copper or copper alloy is contacted with an immersion-type plating bath. Thereby, a thin layer of palladium or a palladium alloy is deposited onto the surface of said copper or copper alloy.

In the immersion-type reaction according to the present invention palladium ions are reduced by copper of the deposited copper or copper alloy to form the reduced metal palladium film on the copper or copper alloy surface. In turn, metallic copper from the copper or copper alloy surface is oxidized to form copper ions which are dissolved in the immersion-type plating solution. This type of reaction is selective, i.e. palladium or palladium alloy deposition only takes place on the copper or copper alloy.

Deposition of the immersion-type palladium or palladium alloy onto the copper or copper alloy in step (iii) can be according to 2 embodiments:

1. The copper or copper alloy deposited in step (ii) is structured to form the circuitry before depositing a palladium or a palladium alloy in step (iii). In this embodiment, the palladium or palladium alloy is selectively deposited on the copper or copper alloy circuitry only.
2. The copper or copper alloy deposited in step (ii) is structured to form the circuitry after depositing a palladium or a palladium alloy in step (iii). In this embodiment, the palladium or palladium alloy is deposited on the entire surface copper or copper alloy. Only thereafter the copper is structured to form the corresponding circuitry. In this embodiment, the palladium is also removed from the surface by the structuring process together with the copper or copper alloy.

The color of the copper or copper alloy is changed by the treatment according to step (iii) of the method according to the present invention from a shiny copper color to a dull grey or dull greyish black or dull black color depending on the thickness of palladium or palladium alloy deposited onto the copper or copper alloy circuitry, the immersion-type plating bath composition and plating parameters such as the plating bath temperature during plating. Thereby, the optical reflectivity of said copper or copper alloy is reduced.

The color of the resulting palladium or palladium alloy deposit can be measured by a colorimeter and the color is described by the L*a*b* color space system (introduced in 1976 by the Commission Internationale de l'Eclairage). The value L* indicates lightness and a* and b* indicate color directions. A positive value of a* indicates a red color while a negative value of a* means a green color. A positive value of b* indicates a yellow color and a negative value of b* means a blue color. When the absolute values for a* and b* increase the saturation of the colors also increases. The value of L* ranges from zero to 100, wherein zero indicates black and 100 means white. Thus, for the palladium or palladium alloy deposits of the present invention a low L* value is desired.

The absolute values vary depend on the specific technical application. Generally, the optical reflectivity of the treated copper or copper alloy surface is adjusted according to type of application and the reflectivity of the surrounding substrate surface.

The L* value of a copper surface before treatment with palladium immersion-type solution usually is in the range of 50 or higher. After treatment, the L* value is significantly reduced to a range of between 10 to 40 or preferably 20 to 35, Thus, the color of the copper or copper alloy after deposition of palladium or palladium alloy is dull grey or dull greyish black or dull black color.

The b* values of the dark palladium deposits of the present invention are in the range of −15.0 to +15.0. Thus, the hue of the dark color of the dark palladium deposits of the present invention ranges from yellowish or brownish to bluish or greyish.

The a* values of the dark palladium deposits of the present invention are in the range of −10.0 to +10.0. Thus, the hue of the dark color of the dark palladium deposits of the present invention is nearly unaffected by the a* value and the small deviations of a* within the color of the dark palladium deposits are not visible by the human eye. L*, a* and b* values for palladium deposits produced with a method of the present invention are shown for in Table 1.

The thickness of the palladium or palladium alloy layer preferably ranges from 1 to 300 nm, more preferably from 10 to 200 nm, even more preferably from 25 to 100 nm and most preferably from 30 to 60 nm. Thereby, the desired reduction of the optical reflectivity is achieved and at the same time less copper is oxidized (and lost as an electrically conductive part of the copper or copper alloy circuitry) compared to blackening methods which form copper oxides on the surface of the copper or copper alloy.

Suitable immersion-type plating bath compositions for depositing a palladium or palladium alloy layer onto said copper or copper alloy comprise at least a solvent and a source for palladium ions.

During immersion-type plating copper and other metals in case of a copper alloy are oxidized and palladium and other metals in case of a palladium alloy are reduced to metallic state and thereby deposited onto the outer surface of the copper or copper alloy. This plating mechanism differentiates said immersion-type plating from e.g. electroless (autocatalytic) plating which utilizes a chemical reducing agent in the plating bath, and electroplating which utilizes an external electrical current applied to electrically conductive parts of the substrate and at least one anode.

The immersion-type plating bath used in step (iii) of the method according to the present invention is preferably an acidic plating bath, more preferably said plating bath has a pH value in the range of 0.5 to 4 and most preferably in the range of 1 to 2.

The source for palladium ions in the immersion-type plating bath is selected from water-soluble palladium salts and water-soluble palladium complex compounds. Suitable water-soluble palladium salts are for example palladium sulfate, palladium acetate, palladium nitrate, palladium chloride, and palladium perchlorate. Suitable water-soluble palladium complex compounds are for example complexes of palladium(II) ions with alkylamines such as ethylene-diamine and counter ions such as sulfate, nitrate and the like.

The concentration of palladium ions in the immersion-type plating bath preferably ranges from 0.01 to 1 g/l, more preferably from 0.05 to 0.3 g/l.

The solvent of the immersion-type plating bath is preferably water.

The immersion-type plating bath utilized in step (iii) of the method according to the present invention preferably further comprises an acid. Suitable acids are for example sulfuric acid, sulfonic acids, carboxylic acids and mixtures thereof.

In case the pH value of the immersion-type plating bath is too low, it can be increased by adding an alkaline substance such as an aqueous sodium hydroxide or potassium hydroxide solution in order to obtain the desired pH value.

The immersion-type plating bath preferably further comprises at least one phosphonate compound which is defined herein as organic compounds containing —C—PO(OH)$_2$ and/or —C—PO(OR)$_2$ groups wherein R is selected from the group comprising substituted and unsubstituted alkyl, aryl and alkaryl.

More preferably, the at least one phosphonate compound is selected from compounds according to formula (1)

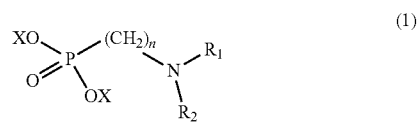

(1)

wherein

R1 is selected from the group consisting of

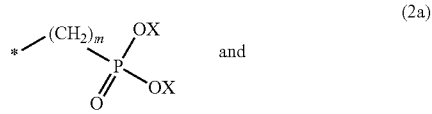

(2a)

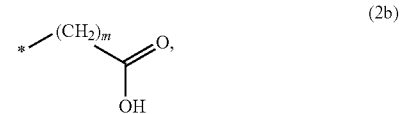

(2b)

hydrogen, methyl, ethyl, propyl and butyl;

R2 is selected from the group consisting of

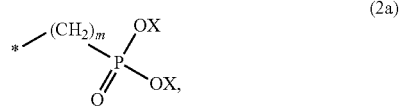

(2a)

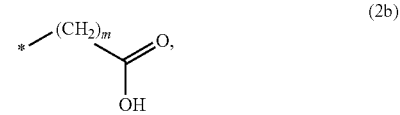

(2b)

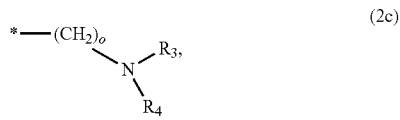

(2c)

hydrogen, methyl, ethyl, propyl and butyl; R3 is selected from the group consisting of

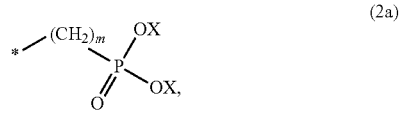

(2a)

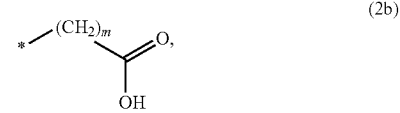

(2b)

hydrogen, methyl, ethyl, propyl and butyl;

R4 is selected from the group consisting of

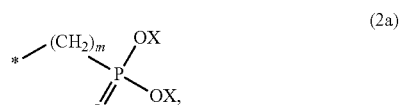

(2a)

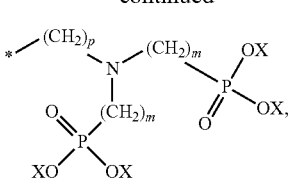

(2d)

hydrogen, methyl, ethyl, propyl and butyl;

n is an integer and ranges from 1 to 6; m is an integer and ranges from 1 to 6; o is an integer and ranges from 1 to 6; p is an integer and ranges from 1 to 6 and X is selected from the group consisting of hydrogen and a suitable counter ion. Suitable counter ions are for example lithium, sodium, potassium and ammonium.

More preferably, R1 and R3 are

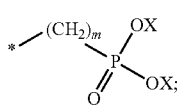

(2a)

R2 is

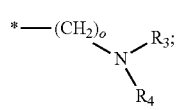

(2c)

and
R4 is

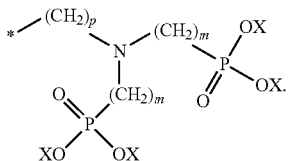

(2d)

Preferably, n, m, o and p independently are selected from 1 and 2. More preferably, n, m are 1; and o and p are 2.

The optional at least one phosphonate compound in the immersion-type plating bath is most preferably selected from the group comprising 1-hydroxyethane-1,1,-diphosphonic acid, hydroxyethyl-amino-di-(methylene phosphonic acid), carboxymethyl-amino-di-(methylene phosphonic acid), amino-tris-(methylene phosphonic acid), nitrilo-tris-(methylene phosphonic acid), ethylendiamine-tetra-(methylene phosphonic acid), hexamethylendiamino-tetra-(methylene phosphonic acid), N-(phosphonomethyl) imidodiacetic acid, diethylenetriamine-N,N,N',N",N"-penta-(methylphosphonic acid), 2-butane phosphonate 1,2,4-tricarboxylic acid, ethane-1,2-bis-(iminobis-(methylphosphonic acid)) and 2-phosphonobutane-1,2,4-tricarboxylic acid.

The concentration of the optional at least one phosphonate compound in the immersion-type plating bath preferably ranges from 0.3 to 20 mmol/l, more preferably from 1.5 to 8 mmol/l.

The optical reflectivity of a copper or copper alloy circuitry is even more reduced when depositing the palladium or palladium alloy layer from an immersion-type plating bath comprising at least one of the above mentioned phosphonate compounds (Example 4). Surprisingly, further investigations showed that a palladium-copper alloy is obtained from an immersion-type plating bath comprising at least one phosphonate compound. The colour of said palladium-copper alloy layer is even darker than the dull grey or dull greyish black colour of palladium layers obtained from immersion-type plating baths which are free of such phosphonate compounds. Accordingly, the optical reflectivity of the copper or copper alloy surface is even further reduced when using an immersion-type plating bath comprising at least one phosphonate compound.

Without being bound by theory, applicants belief that addition of the phosphonate compound influences the immersion-type deposition mechanism of the palladium or palladium alloy onto the copper or copper alloy. Deposition in the presence of the fossil not compound is more controlled and voids which often occur in the underlying metal layer can be reduced significantly. In the present case, the exchange between palladium and the copper reaction does result in less voids in the copper or copper alloy when using a phosphonate additive. This is established in the examples.

Furthermore, the more controlled mechanism in the presence of the phosphonate compound allows to better control the color of the palladium or palladium alloy layer for reducing the optical reflectivity of the copper or copper alloy.

Further optional components in the immersion-type plating bath are for example surfactants, a source for halogenide ions such as NaCl, buffering agents and complexing agents for palladium ions.

Suitable complexing agents for palladium ions as an optional ingredient in the immersion-type plating bath are selected from the group comprising primary amines, secondary amines and tertiary amines. Suitable amines are for example ethylene-diamine, 1,3-diamino-propane, 1,2-bis (3-amino-propyl-amino)-ethane, 2-diethyl-amino-ethyl-amine, diethylene-triamine, diethylene-triamine-penta-acetic acid, nitro-acetic acid, N-(2-hydroxy-ethyl)-ethylene-diamine, ethylene-diamine-N, N-diacetic acid, 2-(dimethyl-amino)-ethyl-amine, 1,2-diamino-propyl-amine, 1,3-diamino-propyl-amine, 3-(methyl-amino)-propyl-amine, 3-(dimethyl-amino)-propyl-amine, 3-(diethyl-amino)-propyl-amine, bis-(3-amino-propyl)-amine, 1,2-bis-(3-amino-propyl)-alkyl-amine, diethylene-triamine, triethylene-tetramine, tetra-ethylene-pentamine, penta-ethylene-hexamine and mixtures thereof.

In case a palladium alloy is deposited in step (iii) of the method according to the present invention, the immersion-type plating bath further comprises a source for metal ions of a metal other than palladium. A suitable metal to be co-deposited with palladium in step (iii) is for example copper. Copper ions present in the immersion-type plating bath may derive from the immersion-type plating reaction with the copper or copper alloy circuitry and are reduced and re-deposited together with palladium onto the copper or copper alloy circuitry to form a palladium-copper alloy.

Copper ions can also be added in form of a water-soluble copper salt such as copper sulfate and/or a water-soluble copper compound to the immersion-type plating bath used in step (iii) of the method according to the present invention in order to obtain a palladium-copper alloy layer. The concentration of copper ions preferably ranges from 50 to 100 mg/l.

Palladium-copper alloys are preferred palladium alloys deposited in step (iii) of the present invention because such alloys have a particularly dark and dull appearance. Accordingly, the optical reflectivity of the copper or copper alloy circuitry is even more reduced than in case of pure palladium deposited onto the copper or copper alloy circuitry.

The term "alloy" is defined herein as intermetallic compounds, intermetallic phases and metallic deposits comprising separate palladium and alloying element(s) domains.

The immersion-type plating bath is preferably held during step (iii) of the method according to the present invention at a temperature in the range between 20 to 60° C., more preferably between 20 to 40° C.

The substrate comprising a copper or copper alloy is preferably contacted with the immersion-type plating bath during step (iii) for 20 to 180 s, more preferably for 30 or 45 to 120 s.

The substrate comprising a copper or copper alloy can be contacted with the immersion-type plating bath applied in step (iii) of the present invention for example in horizontal, reel-to-reel, vertical and vertically conveyorized plating equipment. Such equipment is known in the art.

Preferably, no further metal or metal alloy layer is deposited onto the palladium or palladium alloy layer obtained in step (iii) of the method according to the present invention. In this embodiment, the palladium or palladium alloy layer forms the outermost metal layer on the copper or copper alloy circuitry.

EXAMPLES

The invention will now be illustrated by reference to the following non-limiting examples.

General Procedure:

PET stripes having a size of 30×40 mm$^2$ and comprising a pattern of cured catalytic ink as the plating base were used throughout all examples. The line width of the patterned catalytic ink was between 4 and 12 µm.

Copper was deposited onto the cured catalytic ink from an electroless (autocatalytic) plating bath comprising a source for copper ions, formaldehyde as the reducing agent and tartrate as complexing agent. The plating bath temperature was held at 35° C. during plating and the plating time was 6 min.

L*, a* and b* values were measured by a statistical evaluation of optical microscope images. All values are based on 4 measurements per image with more than 3000 pixel per measurement.

Example 1 (Comparative)

No palladium or palladium alloy layer was deposited onto the copper circuitry deposited by electroless (autocatalytic) plating.

Accordingly, the copper circuitry had a shiny, copper coloured surface with an undesired high optical reflectivity (See Table 1 for colour values).

Example 2 (Comparative)

The copper circuitry deposited by electroless (autocatalytic plating) was subjected to a "blackening" treatment according to US 2013/0162547 A1. A black copper oxide was formed on the surface of the copper circuitry by contacting said copper circuitry with an aqueous solution comprising sodium hydroxide and sodium chlorite.

The optical reflectivity of the copper surface was reduced but the black copper oxide coating could be wiped off with a white towel. Accordingly, the adhesion of the blackening layer on top of the copper circuitry was not sufficient.

Example 3

A palladium layer was deposited by immersion-type plating onto the copper layer from a plating bath consisting of water, palladium sulfate and sulfuric acid.

A sufficiently adhering, dull grey deposit was obtained and the optical reflectivity of the copper surface was reduced by said treatment.

The values according to the colouring scheme are shown in Table 1 for different treatment times (30 s, 60 s and 90 s). It can be seen that the colouring remains approximately constant for the various treatment times.

Figure 2:
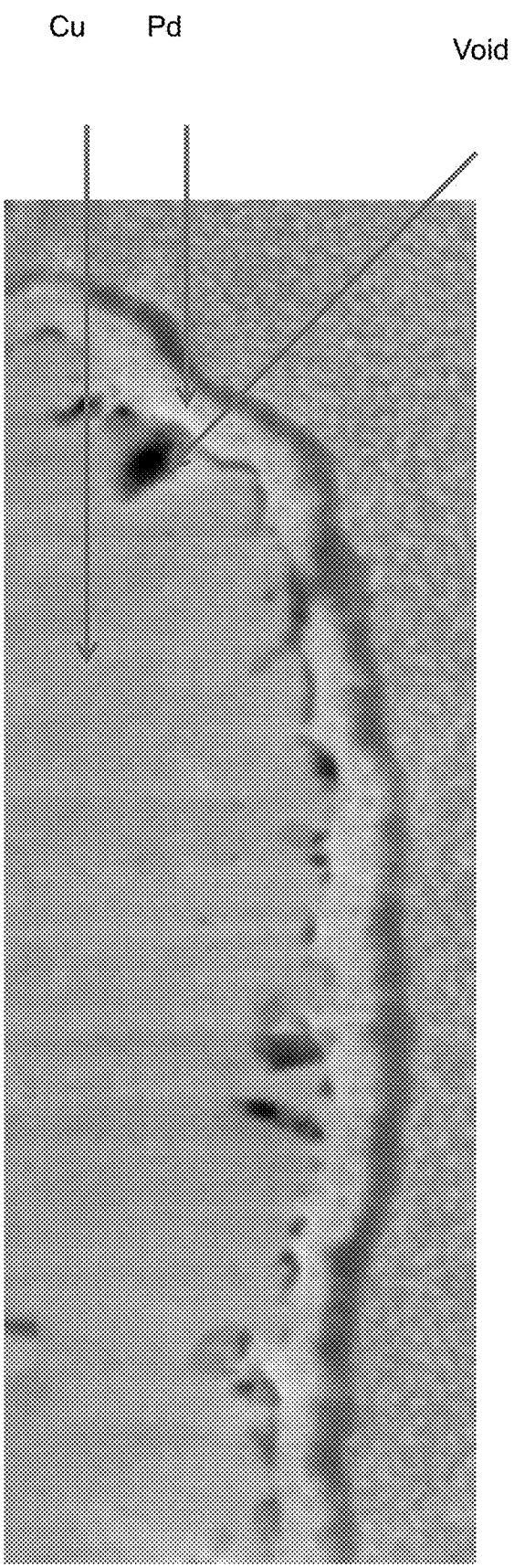
FIG. 2 shows an image of copper circuitry treated with the method according to the present invention (Example 3). FIB/SEM analysis was carried out on a FEI Nova NanoLab 600 Dual Beam FIB. The regions of interest for FIB cuts were sputter coated with carbon to achieve a good contrast to the underlying palladium. On top of the carbon layer a second layer of platinum was applied, which is required to carry out the FIB measurement).

FIG. 2 shows a FIB (Focused Ion Beam) image of a copper circuitry treated according to a method of the present invention. A non uniform palladium layer having a thickness of about 100 nm is formed over the copper layer. Some voids were formed by the immersion-type exchange reaction in the copper circuitry. The amount of voids should be as low as possible, but is still acceptable for the technical applications of the present invention.

Example 4

A uniform palladium layer was deposited by immersion-type plating onto the copper layer from a plating bath consisting of water, palladium sulfate, sulfuric acid and a phosphonate compound (amino-tris-(methylene phosphonic acid)).

A sufficiently adhering, dull greyish-black deposit was obtained and the optical reflectivity of the copper surface was reduced by said treatment even more than in the absence of a phosphonate compound (Example 3).

The values according to the colouring scheme are shown in Table 1 for different treatment times (30 s, 60 s and 90 s). It can be seen that the colouring changes for the various treatment times and can be controlled depending on the desired application. This better control is due to the phosphonate additive in the immersion-type palladium solution.

FIG. 1 shows a FIB (Focused Ion Beam) image of a copper circuitry treated according to a method of the present invention. A palladium layer having a thickness of about 100 nm is formed over the copper layer. The amounts of voids is even less when using an immersion-type composition according to Example 4 (containing phosphonate additive) as compared to Example 3 (FIG. 2).

TABLE 1

|  | Average | | | STDev. | | | Immersion time/ |
| --- | --- | --- | --- | --- | --- | --- | --- |
|  | L* | a* | b* | L* | a* | b* | seconds |
| Copper Surface (Example 1) | 51 | 31 | 36 | 3.8 | 2.1 | 2.6 | 0 |
| Example 4 | 23 | 4 | 5 | 1.4 | 0.6 | 0.9 | 30 |
|  | 29 | 0 | 7 | 3.1 | 0.9 | 1.6 | 60 |
|  | 37 | 3 | 12 | 0.6 | 0.2 | 0.4 | 90 |
| Example 3 | 42 | 5 | 13 | 4.2 | 1.5 | 1.7 | 30 |
|  | 44 | 5 | 13 | 4.3 | 1.1 | 1.5 | 60 |
|  | 44 | 5 | 14 | 4.3 | 1.0 | 1.6 | 90 |

The invention claimed is:

1. A method for reducing the optical reflectivity of a copper or copper alloy circuitry by depositing thereon a metal layer of palladium or palladium alloy comprising, in this order, the steps of
   (i) providing a dielectric substrate,
   (ii) depositing copper or a copper alloy onto said dielectric substrate with the proviso that said dielectric substrate comprises a plating base when copper or a copper alloy is deposited by electroless (autocatalytic) plating or electroplating, and
   (iii) depositing a palladium or palladium alloy layer onto said copper or copper alloy by immersion-type plating and thereby reducing the optical reflectivity of said copper or copper alloy,
   wherein the palladium or palladium alloy is deposited in step (iii) from an aqueous plating bath comprising a source for palladium ions, an acid and at least one phosphonate compound, and
   wherein by the immersion-type plating the palladium ions are reduced by metallic copper of the deposited copper or copper alloy,
   and wherein the copper or copper alloy deposited in step (ii) is structured to form a circuitry either before step (iii) or after step (iii).

2. The method according to claim 1 wherein the copper or copper alloy deposited in step (ii) is structured to form a circuitry before step (iii).

3. The method according to claim 1 wherein the copper or copper alloy deposited in step (ii) is structured to form a circuitry after step (iii).

4. The method according to claim 1 wherein the palladium or palladium alloy layer formed in step (iii) is the outermost metal layer.

5. The method according to claim 1 wherein the dielectric substrate is selected from the group consisting of glass materials and plastic materials.

6. The method according to claim 1 wherein the copper or copper alloy is deposited by electroless (autocatalytic) plating from a plating bath comprising a source for copper ions, a reducing agent, at least one complexing agent and at least one stabilizer additive.

7. The method according to claim 1 wherein the plating base comprises a catalytically active metal which initiates electroless (autocatalytic) plating of copper or a copper alloy thereon or an electrically conductive material which initiates electroplating of copper or a copper alloy thereon.

8. The method according to claim 1 wherein the at least one phosphonate compound is selected from compounds according to formula (1)

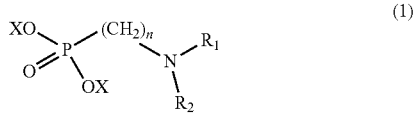

(1)

wherein
R1 is selected from the group consisting of

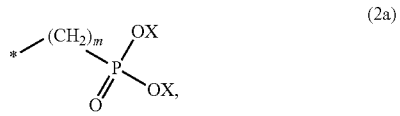

(2a)

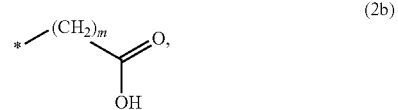

(2b)

hydrogen, methyl, ethyl, propyl and butyl;
R2 is selected from the group consisting of

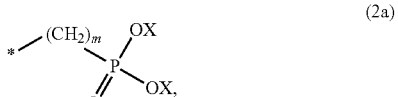

(2a)

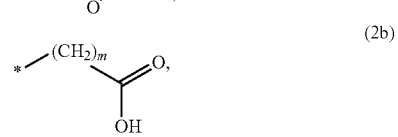

(2b)

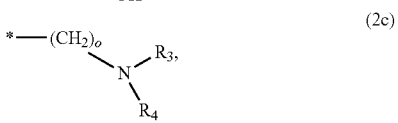

(2c)

hydrogen, methyl, ethyl, propyl and butyl;
R3 is selected from the group consisting of

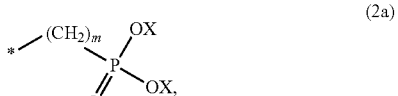

(2a)

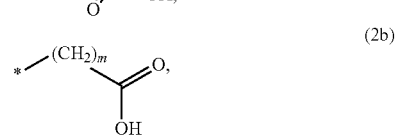

(2b)

hydrogen, methyl, ethyl, propyl and butyl;
R4 is selected from the group consisting of

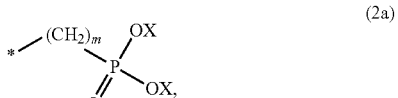

(2a)

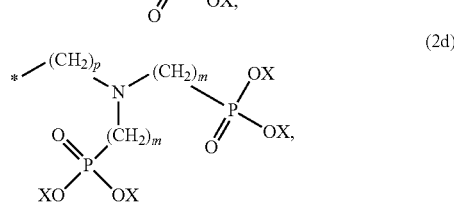

(2d)

hydrogen, methyl, ethyl, propyl and butyl;
n is an integer and ranges from 1 to 6; m is an integer and ranges from 1 to 6; o is an integer and ranges from 1 to 6; p is an integer and ranges from 1 to 6 and
X is selected from the group consisting of hydrogen, lithium, sodium, potassium and ammonium.

9. The method according to claim 1 wherein the concentration of the at least one phosphonate compound ranges from 0.15 to 20 mmol/l.

10. The method according to claim 1 wherein the pH value of the plating bath used in step (iii) ranges from 0.5 to 4.0.

11. The method according to claim 1 wherein the palladium alloy deposited in step (iii) is a palladium-copper alloy.

12. The method according to claim 1 wherein the optical reflectivity is reduced by 30 to 80% of the initial optical reflectivity of the copper or copper alloy circuitry.

13. The method according to claim 8 wherein the concentration of the at least one phosphonate compound ranges from 0.15 to 20 mmol/l.

14. The method according to claim 8 wherein the pH value of the plating bath used in step (iii) ranges from 0.5 to 4.0.

15. The method according to claim 1 wherein in the aqueous plating bath no reducing agent for palladium ions and/or external electrical current is utilized in step (iii).

16. The method according to claim 1 wherein following step (iii), no further metal or metal alloy layer is deposited onto the palladium or palladium alloy layer obtained in step (iii).

* * * * *